United States Patent
Cameron et al.

(10) Patent No.: US 7,582,412 B2
(45) Date of Patent: Sep. 1, 2009

(54) MULTILAYER PHOTORESIST SYSTEMS

(75) Inventors: James F. Cameron, Cambridge, MA (US); Dana A. Gronbeck, Holliston, MA (US); George G. Barclay, Jefferson, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 10/717,975

(22) Filed: Nov. 20, 2003

(65) Prior Publication Data

US 2004/0253535 A1    Dec. 16, 2004

Related U.S. Application Data

(60) Provisional application No. 60/427,809, filed on Nov. 20, 2002.

(51) Int. Cl.
*G03F 7/00* (2006.01)
*G03F 7/004* (2006.01)

(52) U.S. Cl. .................. 430/315; 430/311; 430/270.1; 430/905; 430/927; 430/322

(58) Field of Classification Search .............. 430/270.1, 430/330
See application file for complete search history.

(56) References Cited

U.S. PATENT DOCUMENTS

| | | | |
|---|---|---|---|
| 3,969,543 A | | 7/1976 | Roberts et al. |
| 4,609,614 A | * | 9/1986 | Pampalone et al. ......... 430/323 |
| 4,745,169 A | | 5/1988 | Sugiyama et al. |
| 5,100,503 A | | 3/1992 | Allman et al. |
| 5,240,813 A | | 8/1993 | Watanabe et al. |
| 5,286,607 A | * | 2/1994 | Brown ........................ 430/313 |
| 5,338,818 A | * | 8/1994 | Brunsvold et al. ............ 528/43 |
| 5,525,457 A | | 6/1996 | Nemoto et al. |
| 5,547,808 A | | 8/1996 | Watanabe |
| 5,612,170 A | | 3/1997 | Takemura et al. |
| 5,691,396 A | | 11/1997 | Takemura et al. |
| 5,731,126 A | | 3/1998 | Takemura et al. |
| 5,800,963 A | * | 9/1998 | Knors et al. ............. 430/271.1 |
| 5,851,730 A | | 12/1998 | Thackeray et al. |
| 5,858,621 A | * | 1/1999 | Yu et al. ...................... 430/313 |
| 5,882,844 A | | 3/1999 | Tsuchiya et al. |
| 5,935,760 A | | 8/1999 | Shao et al. |
| 5,972,560 A | | 10/1999 | Kaneko et al. |
| 6,033,830 A | | 3/2000 | Sinta et al. |
| 6,042,990 A | | 3/2000 | Shao et al. |
| 6,048,662 A | * | 4/2000 | Bruhnke et al. .......... 430/270.1 |
| 6,054,254 A | | 4/2000 | Sato et al. |
| 6,080,530 A | | 6/2000 | Shao et al. |
| 6,087,064 A | | 7/2000 | Lin et al. |
| 6,114,085 A | * | 9/2000 | Padmanaban et al. .... 430/270.1 |
| 6,156,479 A | | 12/2000 | Meador et al. |
| 6,165,682 A | * | 12/2000 | Foster et al. ............. 430/270.1 |
| 6,190,839 B1 | | 2/2001 | Pavelchek et al. |
| 6,210,856 B1 | * | 4/2001 | Lin et al. ................. 430/270.1 |
| 6,261,743 B1 | | 7/2001 | Pavelchek et al. |
| 6,309,796 B1 | | 10/2001 | Nakashima et al. |
| 6,316,165 B1 | | 11/2001 | Pavelchek et al. |
| 6,323,310 B1 | | 11/2001 | Puligadda et al. |
| 6,342,562 B1 | * | 1/2002 | Kozawa et al. .............. 524/588 |
| 6,383,941 B1 | * | 5/2002 | Shen et al. .................. 438/714 |
| 6,410,209 B1 | | 6/2002 | Adams et al. |
| 6,420,084 B1 | | 7/2002 | Angelopoulos et al. |
| 6,420,088 B1 | | 7/2002 | Angelopoulos et al. |
| 6,444,320 B1 | | 9/2002 | Takei et al. |
| 6,503,689 B2 | * | 1/2003 | Zampini et al. .......... 430/270.1 |
| 6,524,708 B2 | | 2/2003 | Puligadda et al. |
| 6,528,235 B2 | | 3/2003 | Thackeray et al. |
| 6,576,681 B2 | | 6/2003 | Zampini et al. |
| 6,596,830 B2 | * | 7/2003 | Lee et al. ..................... 526/266 |
| 6,599,951 B2 | | 7/2003 | Zampini et al. |
| 6,602,652 B2 | | 8/2003 | Adams et al. |
| 6,653,049 B2 | | 11/2003 | Pavelchek et al. |
| 2002/0022196 A1 | | 2/2002 | Pavelchek et al. |
| 2002/0028408 A1 | | 3/2002 | Mao et al. |
| 2002/0031729 A1 | | 3/2002 | Trefonas et al. |
| 2002/0045125 A1 | | 4/2002 | Shao et al. |
| 2003/0065164 A1 | | 4/2003 | Puligadda et al. |
| 2003/0129531 A1 | | 7/2003 | Oberlander et al. |
| 2003/0129542 A1 | | 7/2003 | Shih et al. |
| 2003/0180559 A1 | | 9/2003 | Wayton et al. |

FOREIGN PATENT DOCUMENTS

| | | |
|---|---|---|
| EP | 0 408 334 | 1/1991 |
| EP | 1 236 745 | 9/2002 |
| WO | WO 02/086624 A1 | 10/2002 |
| WO | WO 02/091083 A1 | 11/2002 |

* cited by examiner

*Primary Examiner*—Amanda C. Walke
(74) *Attorney, Agent, or Firm*—Peter F. Corless; Darryl P. Frickey; Edwards Angell Palmer & Dodge LLP

(57) ABSTRACT

Multilayer photoresist systems are provided. In particular aspects, the invention relates to underlayer composition for an overcoated photoresist, particularly an overcoated silicon-containing photoresist. Preferred underlayer compositions comprise one or more resins or other components that impart etch-resistant and antireflective properties, such as one or more resins that contain phenyl or other etch-resistant groups and anthracene or other moieties that are effective anti-reflective chromophores for photoresist exposure radiation.

3 Claims, No Drawings

MULTILAYER PHOTORESIST SYSTEMS

This application claims the benefit of U.S. Provisional Application No. 60/427,809 filing date Nov. 20, 2002

BACKGROUND

1. Field of the Invention

The present invention relates generally to multilayer photoresist systems. In particular aspects, the invention relates to underlayer compositions for use with an overcoated photoresist, particularly an overcoated silicon-containing photoresist.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photo-induced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble. In general, photoresist compositions include at least a resin binder component and a photoactive agent.

More recently, chemically-amplified type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups comprising a photoresist binder backbone. See, for example, U.S. Pat. Nos. 5,075,199; 4,968,581; 4,810,613; and 4,491,628 and Canadian Patent Application 2,001,384. Upon cleavage of the blocking group through exposure of a coating layer of such a resist, a polar functional group is formed, e.g. carboxyl or imide, which results in different solubility characteristics in exposed and unexposed areas of the resist coating layer. See also R. D. Allen et al. *Proceedings of SPIE*, 2724:334-343 (1996); and P. Trefonas et al. *Proceedings of the 11th International Conference on Photopolymers (Soc. of Plastics Engineers)*, pp 44-58 (Oct. 6, 1997).

The increasing density of integrated circuits has created a need for higher resolution patterning capabilities. One method of improving resolution involves using a shorter wavelength light during pattern formation. Shorter wavelengths of approximately 200 to 280 nm may be obtained by using a deep UV ("DUV")source such as a mercury/xenon ("Hg/Xe")lamp with appropriate filters. Additionally, KrF (248 nm) or ArF (193 nm) excimer lasers may be used as exposure sources. However, at shorter wavelengths the depth of focus of the exposure tool, which may be an excimer stepper, or step and scan tool, may be adversely affected. The depth of focus ("DOF")is an expression of the range of distances from the image focal plane through which the projected image remains in subjectively acceptable focus. DOF is related to wavelength and lens numerical aperture according to the formula: DOF $\alpha$ $\lambda/2(NA)^2$ where $\lambda$ is the wavelength of exposing light and NA is the numerical aperture of the lens. Generally, a depth of focus of 1 to 2 μm is required for an adequate lithographic process window, in order to accommodate variations in the thickness or height of the resist film.

In addition to using shorter wavelengths during exposure, it is also desirable to use a thinner layer of resist. However, the major drawback of using a thin layer of resist is that the variation of resist thickness over a diffusion step on a substrate and into an etched pattern increases as the pattern size becomes smaller. This variation means that the dimensions of any pattern being imaged in the resist will vary as the step geometry is traversed. Therefore, in a single layer resist system, the lack of dimensional control on the wafer can create different line widths throughout the resist which reduces the quality of the electronic package.

To improve dimensional control, bilayer (or bilevel or multilevel) resist systems are often utilized. In a typical bilevel system, a bottom resist is first applied to a substrate to planarize wafer topography. The bottom resist is cured and a second thinner imaging top resist is then applied over the bottom resist. The top resist is then soft baked, and patterned (or imaged) using conventional resist exposure and development, followed by etch transfer of the top pattern through the bottom resist using the top resist pattern as an etch mask. Positive resists are commonly used in bilayer applications and are typically based on novolac resins, which are condensation polymers of phenols or substituted phenols and formaldehyde. See generally Sugiyama et al., *Positive Excimer Laser Resists Prepared with Aliphatic Diazoketones*, Soc. Plastics Eng., Conference Proceedings, pages 51-60 (November 1988); and U.S. Pat. Nos. 4,745,169 and 5,338,818.

SUMMARY OF THE INVENTION

We now provide new multilayer photoresist systems where one layer comprises a silicon-containing photoresist composition that is coated over an "underlayer" or bottom layer composition.

Underlayer compositions of the invention preferably contain moieties that will provide enhanced etch-resistance (particularly resistance to a plasma etchant) as well as chromophore moieties that can absorb exposure radiation of the overcoated photoresist to prevent or inhibit undesired reflections of that radiation back into the resist layer.

Typically, the etch-resistant moieties and chromophore moieties will be distinct functional groups. The etch resistant moieties and chromophore moieties suitably may be present on a single (integral) component or present as part of distinct (not covalently liked) components of an underlayer composition. It is generally preferred that the etch resistant and chromophore moieties are present on distinct underlayer composition components.

Preferred etch-resistant moieties include aromatic and alicyclic groups, such as optionally substituted phenyl (including phenol), optionally substituted naphthyl, optionally substituted adamantyl, optionally substituted norbomyl, and the like. Optionally substituted phenolic groups are particularly preferred.

Preferred chromophore moieties may vary with the wavelength of the exposure radiation employed to image an overcoated resist layer. For preferred multilayer photoresist systems of the invention that are imaged with deep UV radiation, e.g. less than 300 nm particularly about 248 nm, anthracene is an especially suitable chromophore group. Other aromatic groups also may be employed as chromophore moieties, particularly multicyclic (fused or separate rings) aromatic groups such as naphthylene, phenathracenyl, fluorneyl, acridinyl, and the like.

Preferred underlayer compositions of the invention comprise one or more resins. The etch-resistant and chromophore groups may be present as part of repeat units of one or more such resins. Particularly preferred underlayer compositions of the invention comprise a first resin that comprises etch-resistant moieties and a second resin (distinct i.e. non-covalently linked with respect to the first resin) that comprises chromophore moieties; i.e., the underlayer composition comprises a blend of distinct resins.

Especially preferred underlayer compositions of the invention comprise a phenolic resin that imparts etch-resistance and a second resin that comprises chromophore moieties such as anthracene or other aromatic groups. References herein to a phenolic resin are inclusive of any resin that comprise phenol groups as a component of a repeat unit, and includes copolymers, terpolymers and other higher order polymers such as acrylate/phenolic copolymers and the like. Typically preferred phenolic resins for use in an underlayer composition include novolak resins and poly(vinylphenol) resins.

Suitable resins that include chromophore moieties include acrylate resins, e.g. resins provided by polymerization of methylanthracene methacrylate or methylanthracene acrylate with other reactive monomers.

Suitably, an underlayer composition will be hardened, crosslinked or otherwise treated to minimize intermixing with the overcoated photoresist layer. References herein to crosslinking of the underlayer composition are inclusive of a reaction where covalent bonds are formed between composition components as well as hardening of the composition where covalent may or may not be formed, but intermixing of the underlayer composition with an overcoated photoresist composition layer is reduced.

Preferred crosslinking (hardening) underlayer compositions will be thermally treated prior to application of an overcoated photoresist layer. An underlayer composition also may be treated with radiation (e.g. same having wavelength as subsequently used to image overcoated photoresist) to achieve such crosslinking/hardening.

To facilitate curing/crosslinking/hardening under relatively mild conditions (e.g. thermal treatment less than 180° C.), preferably an underlayer composition will contain an acid or acid generator compound such as a thermal acid generator compound and preferably a separate crosslinker component such as an amine-based material, e.g. a melamine or benzoguanamine resin. For such crosslinking compositions, the applied underlayer may be crosslinked prior to application of the overcoated photoimageable composition, e.g. by suitable thermal treatment such as heating at 140° C., 150° C., 160° C., 180° C. or 200° C. for a time sufficient for crosslinking such as 0.5, 1 or 2 minutes. The underlying polymer composition is suitably non-photoimageable, i.e. an image can not be readily patterned into the underlayer composition coating layer, in distinction from an overcoated resist layer.

Suitable underlayer compositions also may be substantially free of a separate crosslinker component and/or an acid or acid generator compound. Such compositions will be preferably thermally treated under relatively vigorous conditions to effect hardening/crosslinking, e.g. at least 180° C., 190° C. or 200° C. for a time sufficient for hardening such as 0.5, 1 or 2 minutes.

Preferred photoresists for application over an underlayer composition of the invention will contain a polymer that comprises Si atoms. Preferred photoresists for use in the multilayer resist systems of the invention contain phenyl groups, particularly phenolic groups.

Especially preferred photoresists for use in multilayer systems of the invention are chemically-amplified positive resists, i.e. the resists containing a component (e.g. resin) that comprises photoacid-labile groups. Preferred photoacid-labile groups include photoacid-labile esters or acetal groups, such as may be grafted onto phenolic —OH groups. For instance, an ester grafted onto a hydroxy group is a preferred acid-labile group (de-esterification occurs in the presence of photogenerated acid to provide developer-solubilizing carboxy group). Such esters may be provided e.g. by reaction of a haloacetate compound (e.g. tert-butyl chloroacetate) with a phenolic hydroxy group. Acetal groups also are preferred photoacid-labile groups; for example a vinyl ether compound may be grafted onto a phenolic hydroxy moiety to provide a photoacid-labile acetal group. Suitable vinyl ether reagents to provide a photoacid-labile acetal group include compounds having at least one —(CH=CH)—O— group such as ethylvinyl ether and the like.

A particularly preferred copolymer for use in photoresists of systems of the invention includes Si atoms, with repeat units comprising i) phenol, ii) phenyl groups that comprise photoacid-labile moieties, and iii) phenyl groups that are either unsubstituted or substituted by groups that are other than photoacid-labile groups or aqueous, alkaline developing groups, such as sulfonyl acid esters, halogen, alkyl, etc. Preferably, with such polymers, the phenyl groups of units i), ii) and iii) are pendant groups and the polymer backbone comprises linked Si or SiO groups.

The invention also includes substrates coated with a multilayer resist system as disclosed herein. Preferred substrates include e.g. a microelectronic wafer substrate (e.g. a silicon wafer), an optoelectronic device substrate, and the like.

Methods for forming photoresist relief images and processed microelectronic substrates also are provided. Such methods may suitably comprise applying a coating layer of an underlayer composition of the invention over the substrate (which may have one or more other inorganic or organic layers previously applied thereon); optionally treating the applied underlayer composition coating to crosslink (harden) same e.g. by thermal treatment; applying an Si-photoresist layer over the underlayer composition (where one or more inorganic or organic layer may have been interposed); exposing the applied photoresist coating layer to patterned activating radiation particularly sub-300 nm radiation such as 248 nm radiation; and developing the image-wise exposed photoresist coating layer to provide a photoresist relief image. The areas bared of photoresist by development may then by selectively processed, e.g. with a plasma gas that also will penetrate through the underlayer composition coating.

Other aspects of the invention are disclosed infra.

DETAILED DESCRIPTION OF THE INVENTION

As discussed above, we now provide resist systems that include an organic coating layer composition that is beneath a silicon-containing photoresist layer. The underlayer composition comprises etch-resistant and chromophore moieties and may be crosslinked, suitably by thermal treatment prior to application of an overcoated photoresist layer.

Particularly preferred underlayer composition comprises anthracene and phenolic moieties on the same or distinct resins.

Preferably resins of underlayer compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) are suitably determined by gel permeation chromatography.

The concentration of a resin component (may be single resin or blend of multiple resins) in an underlayer composition may vary within relatively broad ranges, and in general the resin(s) are employed in a concentration of from about 60 to 100 weight percent of the total dry components (all components except solvent carrier) of the composition.

Underlayer compositions of systems of the invention optionally but preferably may comprise a crosslinker component. A crosslinker may be an integral portion of another composition component (e.g. crosslinker covalently linked to phenolic resin) or may be a distinct composition component. Suitable crosslinkers for use in an underlayer composition include those discussed below for use in negative resist compositions. Preferred crosslinkers for use in underlayer compositions are amine-based materials, particularly amine-based monomers, oligomers or resins such as a melamine resin, benzoguanamine or glycoluril resin. Commercially available Cymel resins (melamine, benzoguanamine and glycoluril resins) are particularly suitable. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

A crosslinker component of underlayer compositions of the invention in general is suitably present in an amount of between about 5 and 50 weight percent of total solids (all components except solvent carrier) of the underlayer composition, more typically in an amount of about 7 to 25 weight percent total solids.

Underlayer compositions of the invention also optionally but preferably comprise an acid or acid generator for catalyzing an acid or acid generator compound for catalyzing or promoting curing of an underlayer composition coating layer. Thermal acid generator compounds are preferably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon thermal activation are generally preferred. Typically, a thermal acid generator is present in an underlayer composition in a concentration of from about 0.1 to 5 weight percent of total dry components of the composition, more preferably about 2 weight percent of total dry components.

Also, as mentioned, rather than an acid generator compound, an acid may be simply formulated into an underlayer composition. Suitable acids include e.g. strong acids such as sulfonic acids such as toluene sulfonic acid, triflic acid, and mixtures thereof.

Underlayer compositions also may include other optional additives include surface leveling agents, for example, the leveling agent available under the tradename Silwet 7604 from Union Carbide, or the surfactant FC 171 or FC 431 available from the 3M Company.

Underlayer compositions of the invention also may contain one or more photoacid generator compound typically in addition to another acid source such as an acid or thermal acid generator compound. In such use of a photoacid generator compound (PAG), the photoacid generator is not used as an acid source for promoting a crosslinking reaction, and thus preferably the photoacid generator is not substantially activated during crosslinking of the coating composition (in the case of a crosslinking coating composition). In particular, with respect to underlayer compositions that are thermally crosslinked, the coating composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140° C. or 150° C. to 190° C. for 5 to 30 or more minutes.

Generally preferred photoacid generators for such use in underlayer compositions include e.g. onium salts such as di(4-tert-butylphenyl)iodonium perfluoroctane sulphonate, halogenated non-ionic photoacid generators such as 1,1-bis [p-chlorophenyl]-2,2,2-trichloroethane, and other photoacid generators disclosed for use in photoresist compositions.

To make a liquid underlayer coating composition, the underlayer composition components are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an underlayer composition varies from about 0.5 to 20 weight percent of the total weight of the underlayer coating composition, preferably the solids content varies from about 2 to 10 weight of the underlayer coating composition.

Preferred photoresists of the invention comprise an Si-resin that comprises phenyl groups and preferably includes at least the following three repeating units 1) units that contain photoacid-labile groups; 2) units that are free of photoacid-labile and aqueous developing groups; and 3) units that contribute to the aqueous, alkaline developability of a photoresist containing the polymer. Such polymers are particularly useful in chemically-amplified positive acting photoresists (resist has acid-labile groups undergo a cleavage or deblocking reaction in the presence of photoacid during lithographic processing). Such photoresists are disclosed in commonly assigned International application PCT/US02/14732 of the Shipley Company.

Preferred repeat units that can contribute to aqueous developability of a photoresist containing the polymer include hydroxy, carboxy and other polar preferably acidic groups such as sulfonic acid and the like. For instance, a preferred repeat unit of this type is a phenolic unit, or other hydroxy-containing unit.

In such copolymers, units that are free of photoacid-labile and aqueous, alkaline developing groups will be free of moieties as discussed above, i.e. photoacid-labile ester or acetal moieties, or hydroxy, carboxy or sulfonic acid moieties. Preferred repeat units of this type include phenyl or alkyl groups that are not substituted with such photoacid-labile or aqueous, alkaline developing moieties, e.g. alkyl or phenyl groups that are either unsubstituted or substituted by one or more halo, unsubstituted alkyl, non-photoacid labile alkoxy, mesyl groups or other sulfonic esters such as those of the formula $C_{1-8}$alkylSO$_3$— and the like.

In such copolymers, units that are free of photoacid-labile and aqueous, alkaline developing groups will be free of moieties as discussed above, i.e. photoacid-labile ester or acetal moieties, or hydroxy, carboxy or sulfonic acid moieties. Preferred repeat units of this type include phenyl or alkyl groups that are not substituted with such photoacid-labile or aqueous, alkaline developing moieties; e.g. preferred repeat units of this type are alkyl or phenyl groups that are either unsubstituted or substituted by one or more halo, unsubstituted alkyl, non-photoacid labile alkoxy, sulfonyl acid esters, and the like. Such substituents should be substantially stable (i.e. not undergoing a deblocking reaction) under typical lithographic conditions (e.g. pre-exposure thermal treatment of up to 140° C. for 1-2 minutes; exposure; post-exposure thermal treatment of up to about 160° C. for 1-2 minutes; and/or development with an aqueous, alkaline developer solution). Preferred substituents that are non-photoacid-labile and do not substantially promote aqueous developability useful for this type of repeat unit are disclosed as inert blocking groups in U.S. Pat. Nos. 5,736,536 and 5,541,263 both to Thackeray et al. of the Shipley Company. As disclosed in those patents, suitable substituents that are substantially inert to lithographic processing and do not substantially increase aqueous, alkaline developability of a resist containing the polymer include alkoxy groups such as methoxy, ethoxy, propoxy, n-butoxy, sec-butoxy, etc.; alkyl esters represented by RCOO— where R is preferably an alkyl group having 1 to 6 carbon atoms such as methyl, ethyl, propyl, isopropyl, butyl, etc.; sulfonyl acid esters include both alkyl (e.g. $C_{1-6}$alkyl) are carbocyclic aryl esters such as methane sulfonyl, ethane sulfonyl, propane sulfonyl, benzene sulfonyl, and toluene sulfonyl esters, etc. All those groups can be grafted onto hydroxy groups as discussed above to form sulfonyl esters, e.g. by reaction of an alkylhalide such alkylchloride to form an alkoxy group, or an acid halide such as acid chloride to form an alkylester.

In such preferred Si-polymers, phenyl groups are preferably pendant to a polymer backbone that comprises linked Si groups or more preferably linked SiO groups.

Suitable Si-polymer units that comprise photoacid-labile groups have been discussed above and include photoacid-labile ester or acetal groups grafted onto phenolic —OH groups. For instance, a haloacetate reagent such as tert-butyl chloroacetate (ClCH$_2$CO$_2$C(CH$_3$)$_3$) may be reacted with a hydroxy moiety such as a phenolic hydroxy. A carbonate reagent also may be reacted with a hydroxy moiety to provide pendant photoacid-labile esters, e.g. di-tert-butyl dicarbonate (O[CO$_2$C(CH$_3$)$_2$]$_2$) may be reacted with phenolic groups or other polymer hydroxy groups to provide pendent acid-labile ester groups. Reactions of such haloacetate or dicarbonate reagents may be suitably conducted under either acidic or basic conditions such as in the presence of potassium t-butoxide or N,N-dimethylaminopyridine. Basic reaction conditions are generally preferred.

A vinyl ether compound also suitably may be grafted onto a phenolic hydroxy moiety to provide a photoacid-labile acetal group, e.g. a compound having at least one —(CH═CH)—O— groups such as ethylvinyl ether, t-amylvinyl ether, t-butylvinyl ether, vinylisobutyl vinyl ether, vinylpropyl ether, vinyl-2-ethylhexyl ether, vinyloctadecyl ether, and the like, as well as compounds that have two vinyl groups such as hydroxybutylvinyl ether, butanediol-1, 4-divinyl ether, cyclohexylvinyl ether, hexanedioldivinyl ether, and the like, as well as compounds having three vinyl groups such triethyleneglycol divinyl ether, diethyleneglycol monovinyl ether, and the like, as well as compounds having 4 or more vinyl groups such as 1,4-cyclohexanoldimethanoldivinyl ether, propenyl ether of propylene carbonate, 1,1, 1-tris(vinyloxymethyl)ethane, cyclohexanedimethanolmonovinyl ether, and the like.

Suitably, to provide acetal photoacid-labile groups, such vinyl ether compounds may be grafted onto a hydroxy group (e.g. a phenolic group or alcohol group such as $C_{1-12}$hydroxyalkyl) under acidic conditions preferably after dissolving the hydroxy-containing compound and the vinyl ether reagent in a suitable solvent such as one or more of acetone, tetrahydrofuran, diglyme and dioxane. Suitable acid catalysts to use to provide acidic conditions include hydrochloric acid, sulfuric acid, malonic acid and/or a sulfonic acid. Preferably, the molar ratio of free hydroxyl groups to the vinyl ether compound does not exceed 1 to 1, and more preferably the hydroxyl groups are present in a molar excess (e.g. 2:1) relative to the vinyl ether compound. In particular, a preferred synthesis includes grafting vinyl ether onto a preformed Si polymer having hydroxy groups, particularly phenolic groups, where only a portion of the phenolic groups are blocked with photoacid-labile groups and a portion of the phenolic hydroxy groups remain unblocked as aqueous, alkaline developable groups.

Such preferred Si polymers containing phenyl groups and the three distinct repeat can be readily prepared. For instance, a Si-phenyl reagent can be polymerized preferably a hydroxylbenzyl silyl reagent. A formed poly(hydroxybenzyl silsequioxane) can be functionalized to provide three distinct repeat units, e.g. the pendant phenol hydroxy groups can be reacted to have both photoacid-labile groups (such as by reaction of a dicarbonate or a halacetate ester as discussed above) and non-photoacid-labile groups such as provided by reaction of a sulfonyl acid or acid chloride or the like. Preferably, those distinct groups are reacted sequentially with the pre-formed hydroxy silsesquixoane polymer, although it is possible to make both additions to the pre-formed polymer in a single reaction sequence. Preferably, a portion of the hydroxy moieties are left unreacted (i.e. unsubstituted) to provide aqueous, alkaline developing enhancing OH groups. See the examples which follow for particularly preferred reaction schemes, conditions and polymers.

In this preferred copolymer, the three distinct repeat units may be suitably present in a variety of relative amounts. For example, repeat units that have photoacid-labile groups suitably may be present in a polymer from about 1, 2 or 3 to about 60 or 70 mole percent, based on total repeat units of the polymer, more preferably about 5, 10 or 20 to about 30, 40 or 50 mole percent based on total units of the polymer. The repeat unit(s) that do not contain photoacid labile groups and do not substantially increase aqueous, alkaline developability (e.g. mesyl-substituted phenyl) suitably may be present in a polymer from about 1, 2 or 3 to about 50 or 60 mole percent, based on total repeat units of the polymer, more preferably about 5, 10 or 20 to about 30 or 40 or 50 mole percent based on total units of the polymer. The repeat units that increase aqueous, alkaline developability (such as phenol units) suitably may be present in a polymer from about 5 to about 60 or 70 mole percent, based on total repeat units of the polymer, more preferably about 10, 20 or 25 to about 30, 40 or 50 mole percent based on total units of the polymer.

Photoresists used with an underlayer of the invention also may be negative-acting. Typical negative-acting compositions will crosslink in coating layer areas exposed to activating radiation. Preferred negative-acting resist compositions for use in systems of the invention will comprise one or more crosslinking agents.

A variety of aromatic or aliphatic cross-linking agent that reacts with the silicon-containing polymer or oligomer may be suitably employed as a separate crosslinking component for a negative resist. A crosslinking component also may be an integral (covalently linked) portion of an Si-polymer of a resist. Such organic cross-linking agents will cure to form a polymerized network with the silicon-containing polymer or oligomer, and reduce solubility in selected solvents. Such organic cross-linking agents may be monomers or polymers.

Suitable organic cross-linking agents useful in resists of systems of the invention include, but are not limited to: amine containing compounds, epoxy containing materials, compounds containing at least two vinyl ether groups, allyl substituted aromatic compounds, and combinations thereof. Preferred cross-linking agents include amine containing compounds and epoxy containing materials.

The amine containing compounds useful as cross-linking agents in resists of systems of the invention include, but are not limited to: a melamine monomers, melamine polymers, alkylolmethyl melamines, benzoguanamine resins, benzoguanamine-formaldehyde resins, urea-formaldehyde resins, glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Particularly suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins BEETLE™ 60, 65 and 80, also available from Cytec, West Paterson, N.J. A large number of similar amine-based compounds are commercially available from various suppliers.

Melamines are the preferred amine-based cross-linkers. Particularly preferred are alkylolmethyl melamine resins. These resins are typically ethers such as trialkylolmethyl melamine and hexaalkylolmethyl melamine. The alkyl group may have from 1 to 8 or more carbon atoms but is preferably methyl. Depending upon the reaction conditions and the concentration of formaldehyde, the methyl ethers may react with each other to form more complex units.

Particularly suitable amine-based cross-linking agents include those of the following formula:

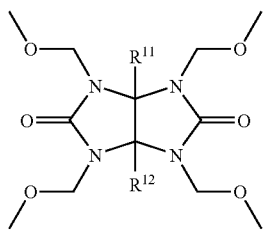

wherein $R^{11}$ and $R^{12}$ are independently selected from H, ($C_1$-$C_6$)alkyl and phenyl. Preferred alkyl groups for $R^{11}$ and $R^{12}$ are methyl and propyl.

Epoxy containing materials useful as cross-linkers in the resists of systems of the invention include a wide variety of organic compounds having one or more oxirane rings that are polymerizable by ring opening. Such materials, broadly called epoxides, include, but are not limited to: monomeric epoxy compounds, and polymeric epoxides that may be aliphatic, cycloaliphatic, aromatic or heterocyclic. Preferred epoxy cross-linking materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer of copolymer). The epoxides may be pure compounds but are generally mixtures containing one, two or more epoxy groups per molecule.

Useful epoxy-containing materials may vary from low molecular weight monomeric materials and oligomers to relatively high molecular weight polymers and may vary greatly in the nature of their backbone and substituent groups. For example, the backbone may be of any type and substituent groups may be any group free of any substituents reactive with an oxirane ring at room temperature. Suitable substituents include, but are not limited to: halogens, ester groups, ethers, sulfonate groups, siloxane groups, nitro groups, phosphate groups, and the like.

Particularly useful epoxy containing materials for resists of systems of the invention include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Such glycidyl ethers include bisphenol A epoxides, such as bisphenol A ethoxylated diepoxide. Further examples of epoxides of this type are described in U.S. Pat. No. 3,018,262, herein incorporated herein by reference to the extent this patent teaches the preparation of such epoxides.

Suitable epoxides useful in resists of systems of the invention include, but are not limited to: epichlorohydrin, glycidol, glycidylmethacrylate, the glycidyl ether of p-tertiarybutylphenol (e.g., those available under the trade name EPI-REZ 5014 from Celanese); diglycidyl ether of Bisphenol A (e.g., those available under the trade designations EPON 828, EPON 1004 and EPON 1010 from Shell Chemical Co.; and DER-331, DER-332 and DER-334 from Dow Chemical Co.), vinylcyclohexene dioxide (e.g., ERL-4206 from Union Carbide Corp.), 3,4-epoxy-6-methyl-cyclohexylmethyl-3,4-epoxy-6-methylcyclohexene carboxylate (e.g., ERL-4201 from Union Carbide Corp.), bis(3,4-epoxy-6-methylcyclohexylmethyl) adipate (e.g., ERL-4289 from Union Carbide Corp.), bis(2, 3-epoxycyclopentyl) ether (e.g., ERL-0400 from Union Carbide Corp.), aliphatic epoxy modified with polypropylene glycol (e.g., ERL-4050 and ERL-4269 from Union Carbide Corp.), dipentene dioxide (e.g., ERL-4269 from Union Carbide Corp.), flame retardant epoxy resins (e.g., DER-580, a brominated bisphenol type epoxy resin available from Dow Chemical Co.), 1,4-butanediol diglycidyl ether of phenol-formaldehyde novolak (e.g., DEN-431 and DEN-438 from Dow Chemical Co.), and resorcinol diglycidyl ether (e.g., KOPOXITE from Koppers Company, Inc.).

Compounds containing at least two vinyl ether groups include, but are not limited to divinyl ethers of aliphatic, cycloaliphatic, aromatic or aralphatic diols. Examples of such materials include divinyl ethers of aliphatic diols having from 1 to 12 carbon atoms, polyethylene glycols, propylene glycols, polybutylene glycols, dimethylcyclohexanes, and the like. Particularly useful compounds having at least two vinyl ether groups include divinyl ethers of ethylene glycol, trimethylene-1,3-diol, diethylene glycol, triethylene glycol, dipropylene glycol, tripropylene glycol, resorcinol, Bisphenol A, and the like.

Suitable allyl substituted aromatic compounds useful as cross-linkers in the present invention are those containing one or more allyl substituents, that is, the aromatic compound is substituted at one or more ring positions by the allylic carbon of an alkylene group). Suitable allyl aromatics include allyl phenyl compounds, such as an allyl phenol. An allyl phenol crosslinker can be a monomer or polymer that contains one or more phenol units where the phenol units are substituted at one or more ring positions by an allylic carbon of an alkylene group. Typically the alkylene substituent(s) is propenyl, i.e., the phenol has one or more propenyl substituents. Preferred allyl phenols include a polycondensate of phenol and hydroxybenzaldehyde and an allylhalide such as allylchloride. A number of suitable allyl phenols are commercially available, for example the allyl phenol sold under the trade name THERMAX SH-150AR by Kennedy and Klim, Inc. (Little Silver, N.J.). Allyl phenyl compounds including allyl phenols are also described in U.S. Pat. No. 4,987,264, herein incorporated by reference to the extent this patent teaches the preparation of such compounds.

Particularly suitable organic cross-linking agents include those containing one or more methoxymethyl groups, such as methoxymethyl-substituted melamines and methoxymethyl-substituted glycourils such as those of formula IV, above. Hexamethoxymethylmelamine is a preferred methoxymethyl-substituted melamine. It is further preferred that one or more of the hydrogens of the organic cross-linking agent, and more preferably one or more of the methyl hydrogens in the methoxymethyl substituent, is substituted with a halogen, preferably fluorine. Thus, preferred cross-linkers include those containing one or more methoxyfluoromethyl and/or methoxydifluoromethyl substituents. Exemplary preferred fluorinated cross-linking agents include methoxyfluoromethyl- and methoxydifluoromethyl-substituted melamines and glycourils, such as hexamethoxyfluoromethylmelamine and hexamethoxydifluoromethylmelamine. Also suitable are fluorinated epoxy cross-linking agents. For certain applications, it is preferred that the cross-linking agent is fluorinated.

The compositions of the present invention may suitably comprise only a single type of organic cross-linker, e.g., only an amine containing cross-linker, or may contain two or more different cross-linkers. When a combination of organic cross-linkers is used in a resist, it is preferred that the combination include an amine containing compound and an epoxy containing compound. The concentration of organic cross-linking agents in the compositions of the present invention may vary within a relatively wide range. It will be appreciated by those skilled in the art that suitable organic cross-linker concentrations will vary with factors such as cross-linker reactivity and specific application of the composition. Typically, the cross-linking agent(s) is present in an amount in the range of 0.1 to 80% by weight, based on the total weight of the composition, preferably in the range of 0.5 to 50%, and more preferably in the range of 1 to 25%.

A wide variety of photoactive components may be used in resists of systems of the invention, including, but not limited to, photoacid generators and photobase generators. Photoacid generators are preferred. It will be appreciated by those skilled in that art that more than one photoactive component may be used advantageously in the photoimageable compositions of the present invention.

Photobase generators useful in the present invention are any compounds which liberate base upon exposure to radiation, such as sub-300 nm radiation, particularly 248 nm radiation. Suitable photobase generators include, but are not limited to: benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, and 4-(ortho-nitrophenyl)dihydropyridines.

The photoacid generators useful in the present invention are any compounds which liberate acid upon exposure to radiation, such as sub-300 nm radiation, particularly 248 nm radiation. Suitable photoacid generators include e.g. halogenated triazines, onium salts, sulfonated esters and halogenated sulfonyloxy dicarboximides.

Particularly useful halogenated triazines include halomethyl-s-triazines. Suitable halogenated triazines include for example, 2-(1-(3,4-benzodioxolyl))-4,6-bis(trichloromethyl)-1,2,5-triazine, 2-(1-(2,3-benzodioxolyl))-4,6-bis(trichloromethyl)-1,3,5-triazine, 2-(1-(3,4-benzodioxolyl))-4,6-bis(tribromomethyl)-1,3,5-triazine, 2-(1-(2,3-benzodioxolyl))-4,6-bis(tribromomethyl)-1,3,5-triazine, 2-(2-furfylethylidene)-4,6-bis(trichloromethyl)-1,3,5-triazine, 2-(2-(5-methylfuryl)ethylidene)-4,6-bis(trichloromethyl)-1,3,5-triazine, 2-(2-(4-methylfuryl)ethylidene)-4,6-bis(trichloromethyl)-1,3,5-triazine, 2-(2-(3-methylfuryl) ethylidene)-4,6-bis-(trichloromethyl)-1,3,5-triazine, 2-(2-(4,5-dimethylfuryl)ethylidene)-4,6-bis(trichloromethyl)-1,3,5-triazine, 2-(2-(5-methoxyfuryl)ethylidene)-4,6-bis (trichloromethyl)-1,3,5-triazine, 2-(2-(4-methoxyfuryl) ethylidene)-4,6-bis(trichloromethyl)-1,3,5-triazine, 2-(2-(3-methoxyfuryl)ethylidene)-4,6-bis (trichloromethyl)-1,3,5-triazine, 2-(2-(4,5-dimethoxy-furyl)ethylidene)-4,6-bis (trichloromethyl)-1,3,5-triazine, 2-(2-furfylethylidene)-4,6-bis(tribromomethyl)-1,3,5-triazine, 2-(2-(5-methylfuryl) ethylidene)-4,6-bis(tribromomethyl)-1,3,5-triazine, 2-(2-(4-methylfuryl)-ethylidene)-4,6-bis(tribromomethyl)-1,3,5-triazine, 2-(2-(3-methylfuryl)ethylidene)-4,6-bis (tribromomethyl)-1,3,5-triazine, 2-(2-(4,5-dimethoxyfuryl) ethylidene)-4,6-bis(tribromomethyl)-1,3,5-triazine, 2-(2-(5-methoxyfuryl)ethylidene)-4,6-bis(tribromomethyl)-1,3,5-triazine, 2-(2-(4-methoxyfuryl)ethylidene)-4,6-bis (tribromomethyl)-1,3,5-triazine, 2-(2-(3-methoxyfuryl)ethylidene)-4,6-bis(tribromomethyl)-1,3,5-triazine, 2-(2-(4,5-dimethoxyfuryl)ethylidene)-4,6-bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis (trichloromethyl)-1,3,5-triazine, 2-phenyl-4,6-bis (tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis (trichloromethyl)-1,3,5-triazine, 2-(1-naphthyl)-4,6-bis (tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924-30 (1969).

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts, quaternary ammonium, phosphonium and arsonium salts, aromatic sulfonium salts and sulfoxonium salts or selenium salts. Examples of suitable onium are disclosed in U.S. Pat. Nos. 4,442,197; 4,603,101; and 4,624,912, all incorporated herein by reference. Sulfonium salts such as triphenylsulfonium hexafluorophosphate are preferred.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3, 337-340 (1991), incorporated herein by reference.

Suitable halogenated sulfonyloxy dicarboximides useful as photoacid generators in the present invention include, but are not limited to: 1(((trifluoromethyl)sulfonyl)oxy)-1H-pyrrole-2,5-dione; N-((perfluorooctanesulfonyl)oxy)-5-norbomene-2,3-dicarboximide; N-((trifluoromethylsulfonyl)oxy)-5-norbornene-2,3-dicarboximide; 1-(((trifluoromethyl)sulfonyl)oxy)-2,5-pyrrolidinedione; 3a,4,7,7a-tetrahydro-2-(((trifluoromethyl)sulfonyl)oxy)-4,7-methano-1H-isoindole-1,3(2H)-dione; 2-(((trifluoromethyl)sulfonyl)oxy)-1H-benz(f)isoindole-1,3(2H)-dione; 3,4-dimethyl-1-(((trifluoromethyl)sulfonyl)oxy)-1H-pyrrole-2,5-dione; 2-(((trifluoromethyl)sulfonyl)oxy)-1H-isoindole-1,3(2H)-dione; 2-(((trifluoromethyl)sulfonyl)oxy)-1H-benz(de)isoquinoline-1,3(2H)-dione; 4,5,6,7-tetrahydro-2-(((trifluoromethyl)sulfonyl)oxy)-1H-isoindole-1,3(2H)-dione; 3a,4,7,7a-tetrahydro-2-(((trifluoromethyl)sulfonyl)oxy)-4,7-epoxy-1H-isoindole-1,3(2H)-dione; 2,6-bis-(((trifluoromethyl)sulfonyl)oxy)-benzo(1,2-c:4,5-c')dipyrrole-1,3,5,7(2H,6H)-tetrone; hexahydro-2,6-bis-(((trifluoromethyl)sulfonyl)oxy)-4,9-methano-1H-pyrrolo(4,4-g)isoquinoline-1,3,5,7(2H,3aH,6H)-tetrone; 1,8,8-trimethyl-3-(((trifluoromethyl)sulfonyl)oxy)-3-azabicyclo(3.2.1)octane-2,4-dione; 4,7-dihydro-2-(((trifluoromethyl)sulfonyl)oxy)-4,7-epoxy-1H-isoindole-1,3(2H)-dione; 3-(1-naphthalenyl)-4-phenyl-1-(((trifluoromethyl)sulfonyl)oxy)-1H-pyrrole-2,5-dione; 3,4-diphenyl-1-(((trifluoromethyl)sulfonyl)oxy)-1H-pyrrole-2,5-dione; 5,5'-(2,2,2-trifluoro-1-(triflluoromethyl)ethylidene)bis(2-(((trifluoromethyl)sulfonyl)oxy)-1H-isoindole-1,3(2H)-dione; tetrahydro-4-(((trifluoromethyl)sulfonyl)oxy)-2,6-methano-2H-oxireno(f)isoindole-3,5(1aH,4H)-dione; 5,5'-oxybis-2-(((trifluoromethyl)sulfonyl)oxy)-1H-isoindole-1,3(2H)-dione; 4-methyl-2-(((trifluoromethyl)sulfonyl)oxy)-1H-isoindole-1,3(2H)-dione; 3,3,4,4-tetramethyl-1-(((trifluoromethyl)sulfonyl)oxy)-2,5-pyrrolidinedione and mixtures thereof. It is preferred that the halogenated sulfonyloxy dicarboximides comprise one or more of 1(((trifluoromethyl)sulfonyl)oxy)-1H-pyrrole-2,5-dione; N-((perfluorooctanesulfonyl)oxy)-5-norbomene-2,3-dicarboximide; N-((trifluoromethylsulfonyl)oxy)-5-norbomene-2,3-dicarboximide and 1-(((trifluoromethyl)sulfonyl)oxy)-2,5-pyrrolidinedione, and more preferably N-((perfluorooctanesulfonyl)oxy)-5-norbornene-2,3-dicarboximide or N-((trifluoromethylsulfonyl)oxy)-5-norbornene-2,3-dicarboximide.

In positive-acting systems of the present invention, the photoactive components are typically added to photoimageable compositions in an amount sufficient to generate a latent image in a coating layer of resist material upon exposure to activating radiation. When the photoactive component is a photoacid generator, the amount is typically in the range of 0.1 to 10 percent by weight, based on the weight of the resin, and preferably 1 to 8 percent by weight.

In negative-acting systems of the present invention, the amount of photoactive component useful is any amount sufficient to catalyze cross-linking of the silicon-containing polymer or oligomer. The photoactive components are typically used in the range of 0.1 to 25% by weight, based on the weight of the composition. It is preferred that the photoactive component is present in an amount in the range of 0.1 to 15% by weight, more preferably in the range of 0.1 to 12% by weight, and still more preferably less than or equal to 5% by weight. A particularly suitable range is from 0.1 to 5% by weight.

Photoresists used in resist systems of the invention may optionally further include one or more additional components, including, but not limited to, solvents, anti-striation agents, plasticizers, surfactants, base additives, speed enhancers, fillers, dyes and the like. In positive-acting systems, a base additive is typically used to adjust the photospeed of the composition. Such optional additives will be present in relatively minor concentrations in a photoresist composition except for fillers and dyes which may be used in relatively large concentrations, e.g. in amounts of from about 5 to 30 percent by weight, based on the total weight of the composition's dry components.

Photoresists used in resist systems of the invention may be readily prepared by those skilled in the art. For example, a resist composition can be prepared by dissolving the components of the photoresist, i.e. polymer binder and photoactive component, in a suitable solvent. Such suitable solvents include, but are not limited to: ethyl lactate, ethylene glycol monomethyl ether, ethylene glycol monomethyl ether acetate, propylene glycol monomethyl ether, propylene glycol monomethyl ether acetate, 3-ethoxyethyl propionate, 2-heptanone, γ-butyrolactone, and mixtures thereof.

Typically, the solids content of the photoresist composition varies from about 5 to about 35 percent by weight, based on the total weight of the composition. The resin binder and photoactive components should be present in amounts sufficient to provide a film coating layer and formation of good quality latent and relief images.

Such photoresist compositions may be applied to a substrate by any known means, such as spinning, dipping, roller coating and the like. When the compositions are applied by spin coating, the solids content of the coating solution can be adjusted to provide a desired film thickness based upon the specific spinning equipment utilized, the viscosity of the solution, the speed of the spinner and the amount of time allowed for spinning.

As discussed, Si-containing photoresists are employed as a top layer in multilayer (bilayer) photoresist system. An underlayer composition is typically applied to or coated on a substrate using any of the above described procedures, particularly by spin-coating. The bottom layer is then suitably thermally treated, under varying conditions depending on the composition's components. More particularly, if the underlayer composition does not contain an acid or acid generator compound and/or crosslinker component, the underlayer composition coating layer is suitably thermally treated under relatively vigorous conditions e.g. at 180° C. or greater for 0.5, 1 or 2 minutes. If the underlayer does contain such curing agent(s), more mild conditions may be suitably employed such as thermal treatment at less than 180° C. e.g. at about 170° C.,m 160° C., 150° C. or 140° C. or less for 0.5, 1 or 2 minutes.

Preferred underlayer composition coatings after hardening will have a thickness of from 0.4 to 1 µm. The top resist layer of a system of the invention is suitably from 0.05 to 1 µm thick, preferably from 0.1 to 0.5 µm, and more preferably from 0.1 to 0.3 µm.

After being coated on a bottom layer, a resist composition is suitably dried by heating (baked) to remove any solvent. It is preferably dried until the coating is tack free. Thereafter, it is imaged through a mask in a conventional manner. The exposure is sufficient to effectively activate the photoactive component of the photoresist to produce a patterned image in the resist coating layer, and more specifically, the exposure energy typically ranges from about 1 to 100 $mJ/cm^2$, dependent upon the exposure tool and the components of the photoresist composition.

The photoimageable compositions of the present invention may be activated by a variety of exposure wavelengths, such as 248, 193, 157 nm and 11-15 nm. However, the photoimageable compositions of the present invention may be used with other radiation sources, such as, but not limited to, visible, e-beam, ion-beam and x-ray.

Following exposure, the film top layer of the composition is preferably baked at temperatures ranging from about 70° C. to 160° C. Thereafter, the top layer film is developed to form an etch pattern, such as treatment with an aqueous based developer, such as quaternary ammonium hydroxide solutions, such as tetra-alkyl ammonium hydroxide, preferably a 0.15 to 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like.

The pattern is next transferred to the underlayer or bottom layer by etching, such as with an oxygen reactive ion etch process. After such processing, the resists, both top and bottom layers, may be removed from the processed substrate using any stripping procedures known in the art.

Photoresist systems of the invention are useful in all applications where photoresists are typically used. For example, the compositions may be applied over silicon wafers or silicon wafers coated with silicon dioxide for the production of microprocessors and other integrated circuit components. Aluminum-aluminum oxide, gallium arsenide, ceramic, quartz, copper, glass, spin-on organic dielectrics, spin-on or chemical vapor deposited inorganic dielectrics, and the like are also suitable employed as substrates for the photoresist compositions of the invention. Other chemical vapor deposited layers, such as cap layers, etch stops and the like, may also be used as substrates.

Alternatively, the present compositions may also be used in optoelectronics applications, such as in the manufacture of optical waveguides. By "optical waveguide" is meant any device that transmits optical radiation across a two-dimensional substrate surface. Suitable optical waveguides include, but are not limited to, splitters, couplers, spectral filters, polarizers, isolators, wavelength division multiplexing structures, and the like. Such waveguides may also contain active functionality, such as amplification and switching such as with electro-optic, thermo-optic or acousto-optic devices. To be useful as amplifiers, the present waveguides typically contain one or more dopants. Erbium is an exemplary dopant. Such dopants are well known in the art. Thus, the present waveguides suitable for use as amplifiers contain one or more dopants.

The waveguides of the present invention may be manufactured as individual waveguides or as an array of waveguides. Whether such waveguides are prepared as an array depends on the particular use and is within the ability of one skilled in the art.

In one embodiment, optical waveguides may be prepared by first disposing a layer of the present compositions on a substrate by any means including, but not limited to, screen coating (or screen printing), curtain coating, roller coating, slot coating, spin coating, flood coating, electrostatic spray, spray coating, dip coating or as a dry film. When the compositions of the present invention are spray coated, a heated spray gun may optionally be used. The viscosity of the composition may be adjusted to meet the requirements for each method of application by viscosity modifiers, thixotropic agents, fillers and the like. Any substrate suitable for supporting a waveguide may be used with the present compositions. Suitable substrates include, but are not limited to, substrates used in the manufacture of electronic devices such as printed wiring boards and integrated circuits. Particularly suitable substrates include laminate surfaces and copper surfaces of copper clad boards, printed wiring board inner layers and outer layers, wafers used in the manufacture of integrated circuits, liquid crystal display ("LCD")glass substrates and the like.

The coated substrate is typically then cured, such as by baking, to remove any solvent. Such curing may be a variety of temperatures, depending upon the particular solvent chosen. Suitable temperatures are any that are sufficient to substantially remove any solvent present. Typically, the curing may be at any temperature from room temperature (i.e., 25° C.) to 170° C. Such curing typically occurs over a period of from 5 seconds to 30 minutes. Such curing may be affected by heating the substrate in an oven or on a hot plate.

After curing, the layer of resist of a system of the invention disposed on the substrate is then imaged by exposure to actinic radiation through appropriate artwork or a mask. Following exposure, the resist composition is then cured at a temperature of from 40° to 170° C. followed by development.

Following development, the present waveguides may undergo a final cure step, or re-flow step. In such final cure step, the waveguides may be heated at a temperature in from about 130° to 225° C. in air or inert atmospheres such as nitrogen or argon. Such final cure step aids in removal of residual solvent, removal of hydroxyl groups from the silsesquioxane polymer such as by increasing the extent of crosslinking, alter the waveguide profile such as to reduce surface roughness, and improves the optical transmission properties of the material.

Optical waveguides typically have a core and a cladding, wherein the cladding has a lower index of refraction as compared to the core. Particularly useful waveguides have core having an index of refraction of from 1.4 to 1.55. Typically, suitable cladding has an index of refraction of from 1.3 to 1.54.

It is preferred that a cladding layer is first deposited on a substrate. If the cladding layer is photocurable or thermocurable, it may be blanket cured as a first step. The photodefinable core material is then deposited on the cladding layer, imaged and the unexposed areas optionally removed. A second cladding layer is then deposited on the imaged waveguide. The second cladding layer may be the same or different from the first cladding layer. However, the indices of refraction of the first and second cladding layers should be the same. The second cladding layer is then cured, or imaged in the case of a photocurable cladding composition, to provide a waveguide structure.

The following examples are presented to illustrate further various aspects of the present invention, but are not intended to limit the scope of the invention in any aspect. All documents mentioned herein are incorporated herein by reference.

EXAMPLE 1

Underlayer Composition of the Invention

An underlayer (bottom layer) composition of the invention is prepared by admixing the following materials in the specified amounts:

Resins
 Poly(vinylphenol) having mesyl substitution
 Terpolymer containing polymerized units of methylmethylacrylate/anthracene acrylate/ethylhydroxyacrylate Crosslinkers
 3-methyl-6-propyl-tetramethoxy glycoluril (in an amount of 4.5 weight % of resin component)
 hexamethoxymethyl melamine (tradename Cymel) (in an amount of 5 weight % of resin component)

Acid Generator
 Dodecylbenzene sulfonic acid (tradename Nacure 5225) (in an amount of 0.5 weight % of resin component)

Surfactant
 Siloxane surfactant (in an amount of 0.3 weight % of resin component)

Solvent
 90:10 v:v blend of propylene glycol monomethyl ether: ethyl lactate (to provide 90 weight % fluid formulation)

EXAMPLE 2

Photoresist Preparation

Part A. Silicon-containing Polymer Preparation.
Part 1.
Poly(4-hydroxybenzyl silsesquioxane) (254.7 g) is dissolved in 1000 mL dry acetone under nitrogen atmosphere in a dried 3 L flask (reactor). Methanesulfonyl chloride (23.8 g) is added and the reactor is cooled to 15° C. A solution of distilled triethylamine (21.9 g) and acetone (22 g) is gradually added dropwise over 20-30 minutes, maintaining a reaction temperature of less than 30° C. Stirring is continued for 3 hours, at which time the solution is added dropwise over 2 h. to 32 L of water, precipitating the polymer. The polymer is then collected by suction filtration, and suspended in 8 L of water with stirring at room temperature for 18 h. The solid is then collected by suction filtration, is washed with water until the effluent is pH neutral, air-dried for 48 h., and is then dried in vacuo for 24 h. at 70° C. to yield an off-white polymer, having the formula 95 mol % hydroxybenzylsilsesquioxane/5 mol % mesylatedbenzylsilsesquioxane. Yield: 246 g (85% of theory). GPC data (RI detection): Mw=6,362; Mn=3,448; molecular weight polydispersity=1.84. $T_g$=90° C. Dissolution Rate (0.26 N TMAH)=5,591 Å/sec. The resulting isolated polymer contains 5-7% methanesulfonation, as determined by $^1$H NMR.

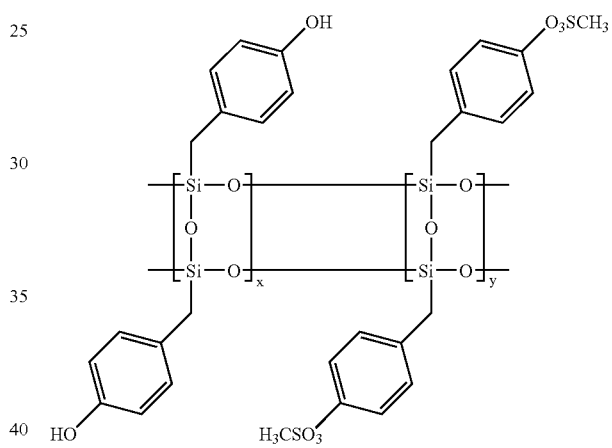

Part 2.
5% Mesylated poly(4-hydroxybenzyl silsesquioxane) (163.1 g) from Part 1 is dissolved in 750 mL dry acetone under nitrogen atmosphere in a dried 2 L flask (reactor). Di-t-butyl dicarbonate (65.5 g) is dissolved in 300 mL acetone and added to the reactor, followed by N,N-dimethylaminopyridine ("DMAP",0.25 g) dissolved in 2 mL acetone, and the resulting pale orange solution is stirred 25° C. for 25 h. The acetone solution of polymer is added dropwise over 2 h. to 24 L of water, precipitating the polymer. The polymer is then collected by suction filtration, is washed with water, and dried in vacuo at 20° C. to constant weight (ca. 72 h.) to yield an off-white polymer, having the formula 65 mol % hydroxybenzylsilsesquioxane/5 mol % mesylatedbenzylsilsesquioxane/30 mol % tert-butoxycarbonato benzylsilsesquioxane as shown by the following general formula where x=0.65, y=0.05 and z=0.3. Yield: 174 g (90% of theory). GPC data (RI detection): Mw=6,216; Mn=3,636; molecular weight polydispersity=1.70. Dissolution Rate (0.26 N TMAH)=0.95 Å/sec.

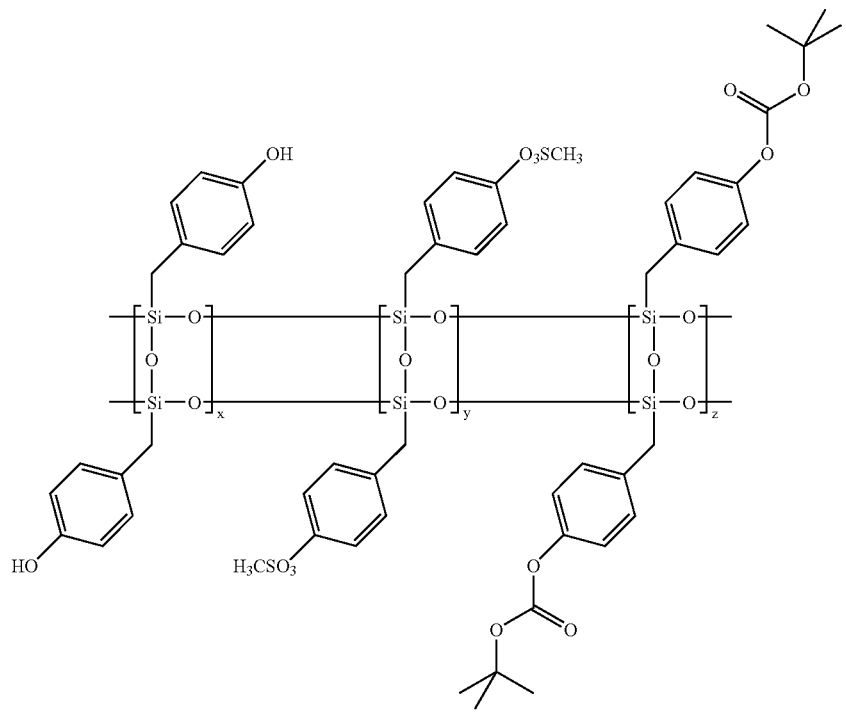

Part B. Photoresist Preparation.

An imaging layer is formulated using the polymer of Part A of this Example 2. A sample is prepared by combining 9.09% w/w of the polymer of Part A of this Example 2, 0.85% w/w of methanoindene diimido triflate as photoacid generator, 0.051% w/w of tetrabutylammonium hydroxide, 0.02% w/w of surfactant, and 89.983% w/w of a 9:1 w/w blend of two ester solvents.

Example 3

Multilayer Photoresist System

The underlayer composition prepared in Example 1 above is spin-coated onto an 8 inch silicon wafer and baked at 175° C. for 60 seconds to remove solvent and provide a crosslinked coating layer.

A silicon-containing photoresist of Example 2 above is applied over the thus thermally treated underlayer by spin-coating. This sample is spin coated on a wafer, is baked at 90° C. for 90 seconds, and is then imaged on an ASML 0.63 NA DUV stepper using a Global 5-Line reticle and annular illumination (0.85 outer, 0.55 inner).

The foregoing description of the invention is merely illustrative thereof, and it is understood that variations and medications can be made as set forth in the following claims.

What is claimed is:

1. A method for forming a photoresist relief image comprising:
   a) applying an organic underlayer composition coating layer on a substrate, the underlayer composition comprising (i) a first resin that comprises phenol groups; (ii) a second acrylate resin that is distinct from the first resin and comprises one or more anthracene groups; (iii) a crosslinker component that is distinct from the first resin and second resin, the crosslinker comprising a benzoquanamine compound or a melamine compound; and (iv) an acid or acid generator compound;
   b) applying a positive-acting photoresist composition coating layer over the underlayer composition, the photoresist composition comprising a photoactive component and one or more resins that comprise Si groups, phenolic groups and photoacid-labile groups; and
   c) exposing the photoresist layer to radiation having a wavelength of about 248 nm.

2. The method of claim 1 wherein the crosslinker component comprises a benzoquanamine compound.

3. The method of claim 1 wherein the crosslinker component comprises a melamine compound.

* * * * *